US012601770B2

(12) United States Patent
Xue et al.

(10) Patent No.: US 12,601,770 B2
(45) Date of Patent: Apr. 14, 2026

(54) VOLTAGE DETECTOR DEVICE HAVING TRIMMING MECHANISM AND VOLTAGE DETECTION METHOD

(71) Applicant: SigmaStar Technology Ltd., Xiamen (CN)

(72) Inventors: Jian Feng Xue, Xiamen (CN); Xiang Zhang, Shanghai (CN); Zhun Chen, Shanghai (CN); Wei-Ping Wang, Taiwan (TW); Chih Liang Wang, Taiwan (TW)

(73) Assignee: SIGMASTAR TECHNOLOGY LTD., Xiamen (CN)

( * ) Notice: Subject to any disclaimer, the term of this patent is extended or adjusted under 35 U.S.C. 154(b) by 267 days.

(21) Appl. No.: 18/621,604

(22) Filed: Mar. 29, 2024

(65) Prior Publication Data

US 2024/0353452 A1      Oct. 24, 2024

(30) Foreign Application Priority Data

Apr. 24, 2023   (CN) .......................... 202310450783.2

(51) Int. Cl.
G01R 19/25 (2006.01)
G01R 19/00 (2006.01)

(52) U.S. Cl.
CPC ..... G01R 19/2503 (2013.01); G01R 19/0038 (2013.01)

(58) Field of Classification Search
CPC ........... G01R 19/2503; G01R 19/0038; G01R 35/005; G01R 35/007; G01R 1/28
See application file for complete search history.

(56) References Cited

U.S. PATENT DOCUMENTS

| | | | | |
|---|---|---|---|---|
| 10,613,561 B1 * | 4/2020 | Jeong | .................... | H03K 17/223 |
| 2021/0226537 A1 * | 7/2021 | Zhou | ..................... | H02M 3/157 |
| 2021/0351771 A1 * | 11/2021 | Arakawa | ............... | G06F 1/3203 |

* cited by examiner

*Primary Examiner* — Dominic E Hawkins

(74) *Attorney, Agent, or Firm* — Edell, Shapiro & Finnan, LLC

(57) ABSTRACT

A voltage detection method includes: outputting a corresponding one of voltages to be an input voltage according to a clock signal, a first detection signal, a reset signal and multiple first bits; generating the reset signal according to the clock signal and multiple currents, wherein the voltages and the currents are generated based on a power supply voltage; comparing the input voltage with a reference voltage to generate a second detection signal, and generating the first detection signal according to the second detection signal and an enable signal; and adjusting the first bits by a digital circuit according to the second detection signal during a trimming phase to determine the first bits, and outputting the first bits by the digital circuit and resetting the digital circuit according to the first detection signal during a voltage detection phase.

12 Claims, 9 Drawing Sheets

100

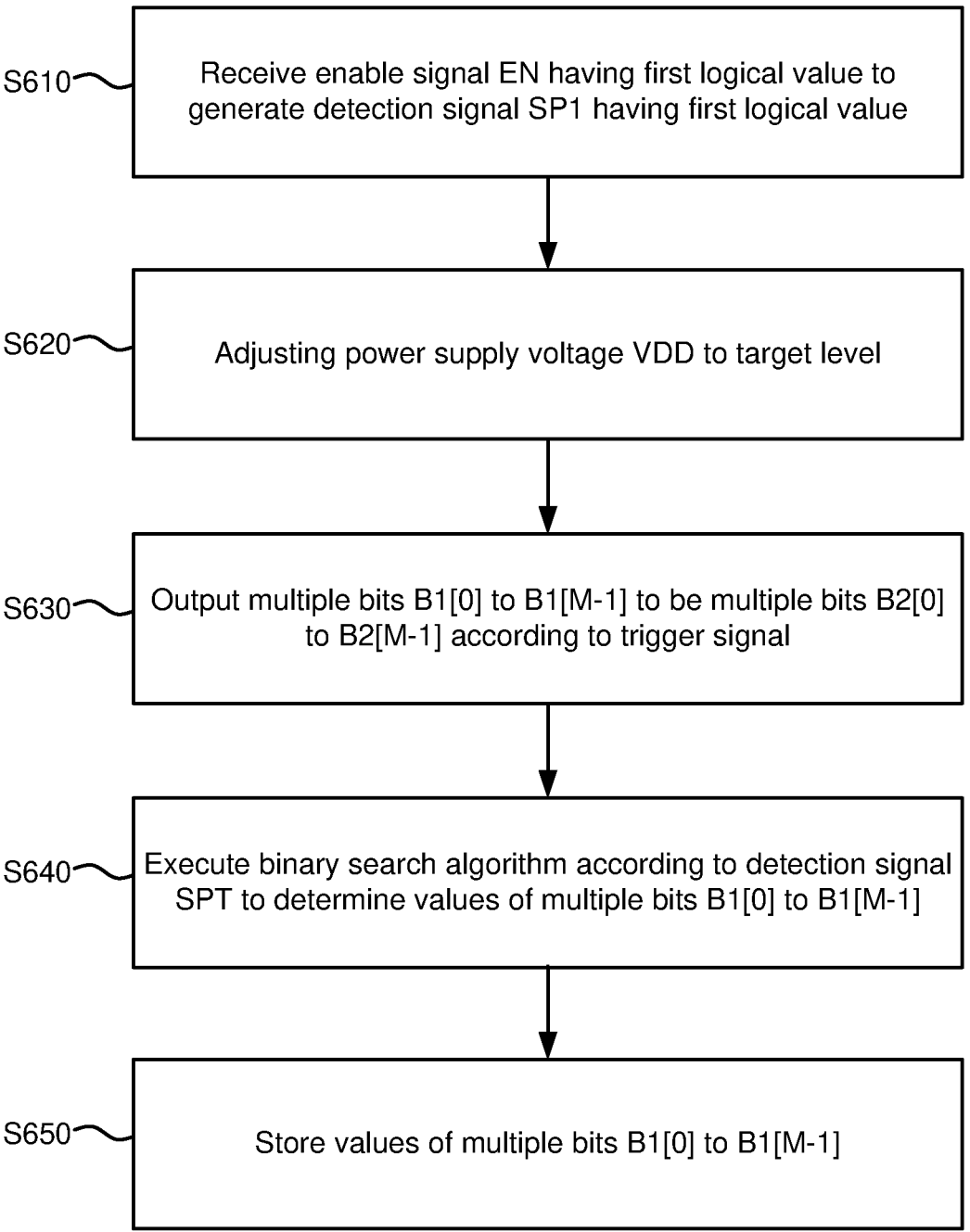

S610 — Receive enable signal EN having first logical value to generate detection signal SP1 having first logical value S620 — Adjusting power supply voltage VDD to target level S630 — Output multiple bits B1[0] to B1[M-1] to be multiple bits B2[0] to B2[M-1] according to trigger signal S640 — Execute binary search algorithm according to detection signal SPT to determine values of multiple bits B1[0] to B1[M-1]

S650 — Store values of multiple bits B1[0] to B1[M-1]

FIG. 6

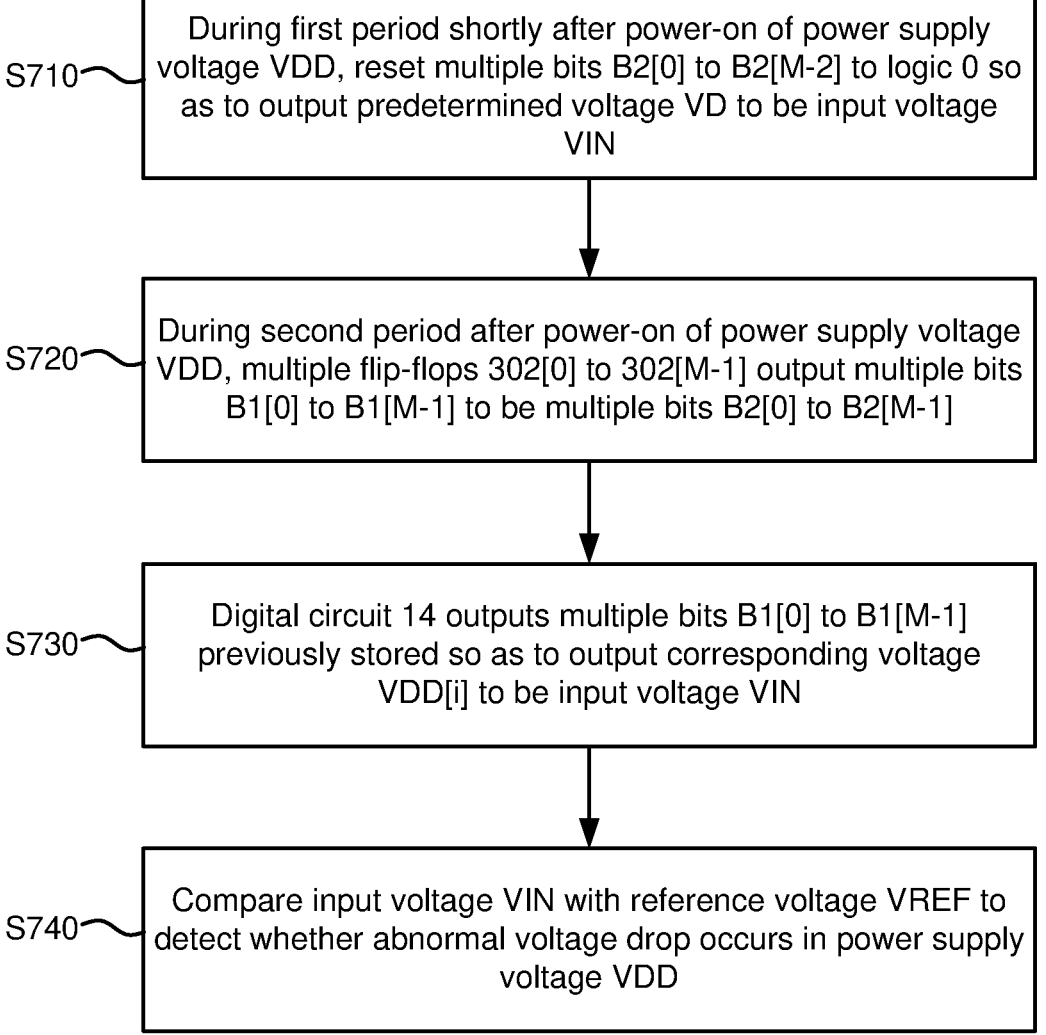

S710 — During first period shortly after power-on of power supply voltage VDD, reset multiple bits B2[0] to B2[M-2] to logic 0 so as to output predetermined voltage VD to be input voltage VIN S720 — During second period after power-on of power supply voltage VDD, multiple flip-flops 302[0] to 302[M-1] output multiple bits B1[0] to B1[M-1] to be multiple bits B2[0] to B2[M-1]

S730 — Digital circuit 14 outputs multiple bits B1[0] to B1[M-1] previously stored so as to output corresponding voltage VDD[i] to be input voltage VIN S740 — Compare input voltage VIN with reference voltage VREF to detect whether abnormal voltage drop occurs in power supply voltage VDD

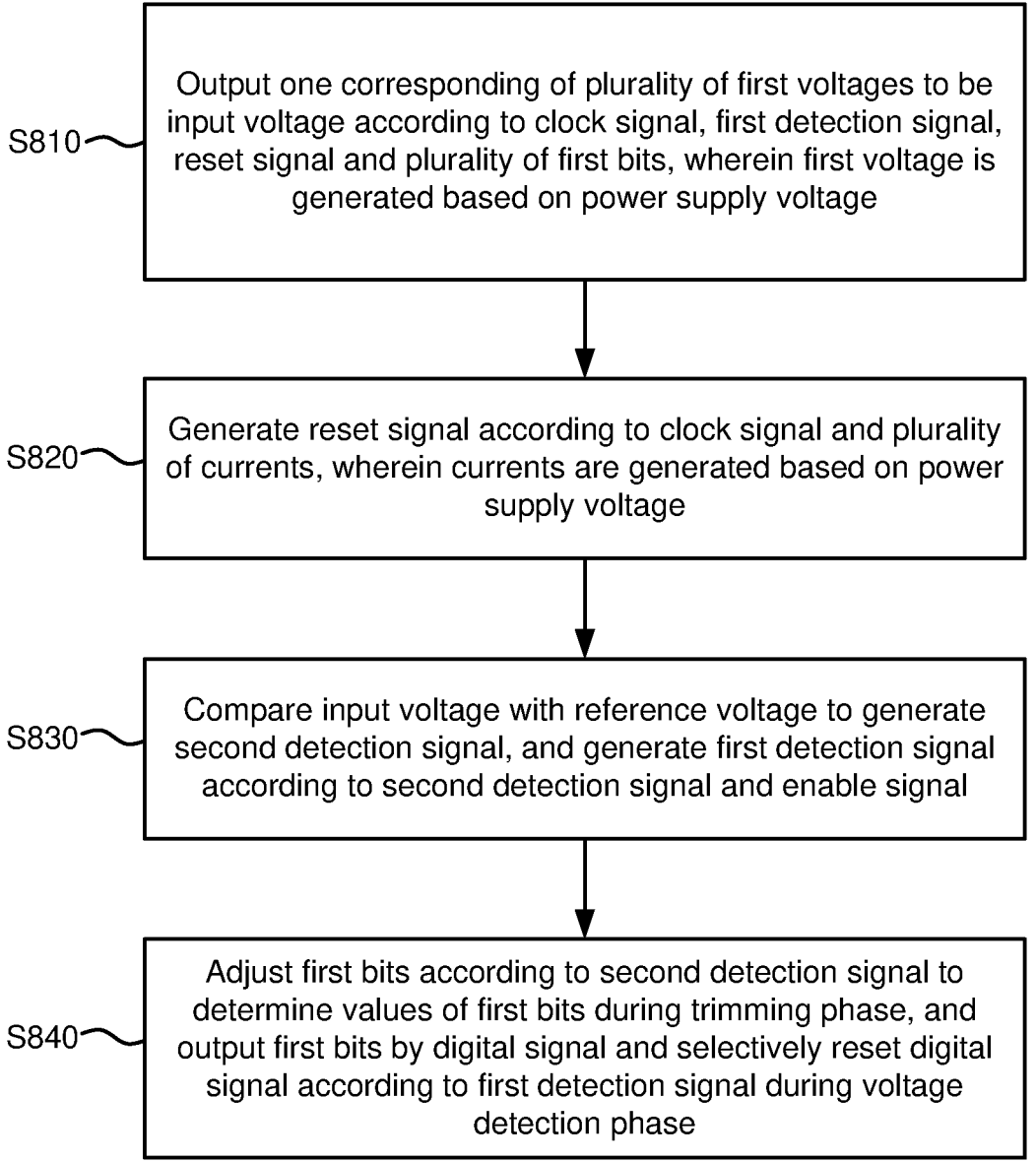

S810 — Output one corresponding of plurality of first voltages to be input voltage according to clock signal, first detection signal, reset signal and plurality of first bits, wherein first voltage is generated based on power supply voltage S820 — Generate reset signal according to clock signal and plurality of currents, wherein currents are generated based on power supply voltage S830 — Compare input voltage with reference voltage to generate second detection signal, and generate first detection signal according to second detection signal and enable signal S840 — Adjust first bits according to second detection signal to determine values of first bits during trimming phase, and output first bits by digital signal and selectively reset digital signal according to first detection signal during voltage detection phase

VOLTAGE DETECTOR DEVICE HAVING TRIMMING MECHANISM AND VOLTAGE DETECTION METHOD

This application claims the benefit of China application Serial No. CN202310450783.2, filed on Apr. 24, 2023, the subject matter of which is incorporated herein by reference.

BACKGROUND OF THE INVENTION

Field of the Invention

The present application relates to a voltage detector device, and more particularly to a voltage detector device and a voltage detection method having a trimming mechanism.

Description of the Related Art

In current electronic devices, if an instantaneous voltage drop in a power supply voltage or an internal voltage is generated due to factors such as a sudden shutdown, failure or operation errors of circuits in the electronic device may be resulted. In the prior art, a voltage detector device determines by comparing a reference voltage with a power supply voltage (or a voltage generated based on a power supply voltage) whether an overly large voltage drop occurs in a power supply voltage. Since a reference voltage may be drifted due to manufacturing variations, a voltage detector device uses a high-precision bias circuit to generate a reference voltage or an additional correction circuit to correct a reference voltage, resulting in a significant increase in circuit costs.

SUMMARY OF THE INVENTION

In some embodiments, it is an object of the present application to provide a voltage detector device and a voltage detection method with a trimming mechanism so as to improve the issues of the prior art.

In some embodiments, a voltage detector device includes a reference voltage selection circuit, a reset signal generation circuit, a voltage detector and a digital circuit. The reference voltage selection circuit outputs a corresponding one of a plurality of first voltages to be an input voltage according to a clock signal, a first detection signal, a reset signal and a plurality of first bits, wherein the first voltages are generated based on a power supply voltage. The reset signal generation circuit generates the reset signal according to the clock signal and a plurality of currents, wherein the currents are generated based on the power supply voltage. The voltage detector compares the input voltage with a reference voltage to generate a second detection signal, and generates the first detection signal according to the second detection signal and an enable signal. The digital circuit adjusts the first bits according to the second detection signal to determine values of the first bits during a trimming phase, and outputs the first bits and is selectively reset according to the first detection signal during a voltage detection phase.

In some embodiments, a voltage detection method includes operations of: outputting a corresponding one of a plurality of first voltages to be an input voltage according to a clock signal, a first detection signal, a reset signal and a plurality of first bits, wherein the first voltages are generated based on a power supply voltage; generating the reset signal according to the clock signal and a plurality of currents, wherein the currents are generated based on the power supply voltage; comparing the input voltage with a reference voltage to generate a second detection signal, and generating the first detection signal according to the second detection signal and an enable signal; and adjusting the first bits by a digital circuit according to the second detection signal to determine values of the first bits during a trimming phase, and outputting the first bits by the digital circuit and selectively resetting the digital circuit according to the first detection signal during a voltage detection phase.

Features, implementations and effects of the present application are described in detail in preferred embodiments with the accompanying drawings below.

BRIEF DESCRIPTION OF THE DRAWINGS

To better describe the technical solution of the embodiments of the present application, drawings involved in the description of the embodiments are introduced below. It is apparent that, the drawings in the description below represent merely some embodiments of the present application, and other drawings apart from these drawings may also be obtained by a person skilled in the art without involving inventive skills.

FIG. 6 is a flowchart of multiple operations performed by the voltage detector device in FIG. 2 during a trimming phase according to an embodiment of the present application;

FIG. 7 is a flowchart of multiple operations performed by the voltage detector device in FIG. 2 during a voltage detection phase according to an embodiment of the present application; and FIG. 8 is a flowchart of a voltage detection method according to some embodiments of the present application.

DETAILED DESCRIPTION OF THE INVENTION

All terms used in the literature have commonly recognized meanings. Definitions of the terms in commonly used dictionaries and examples discussed in the disclosure of the present application are merely exemplary, and are not to be construed as limitations to the scope or the meanings of the present application. Similarly, the present application is not limited to the embodiments enumerated in the description of the application.

The term "coupled" or "connected" used in the literature refers to two or multiple elements being directly and physically or electrically in contact with each other, or indirectly and physically or electrically in contact with each other, and may also refer to two or more elements operating or acting with each other. As given in the literature, the term "circuit" may be a device connected by at least one transistor and/or at least one active element by a predetermined means so as to process signals.

Figure 1:
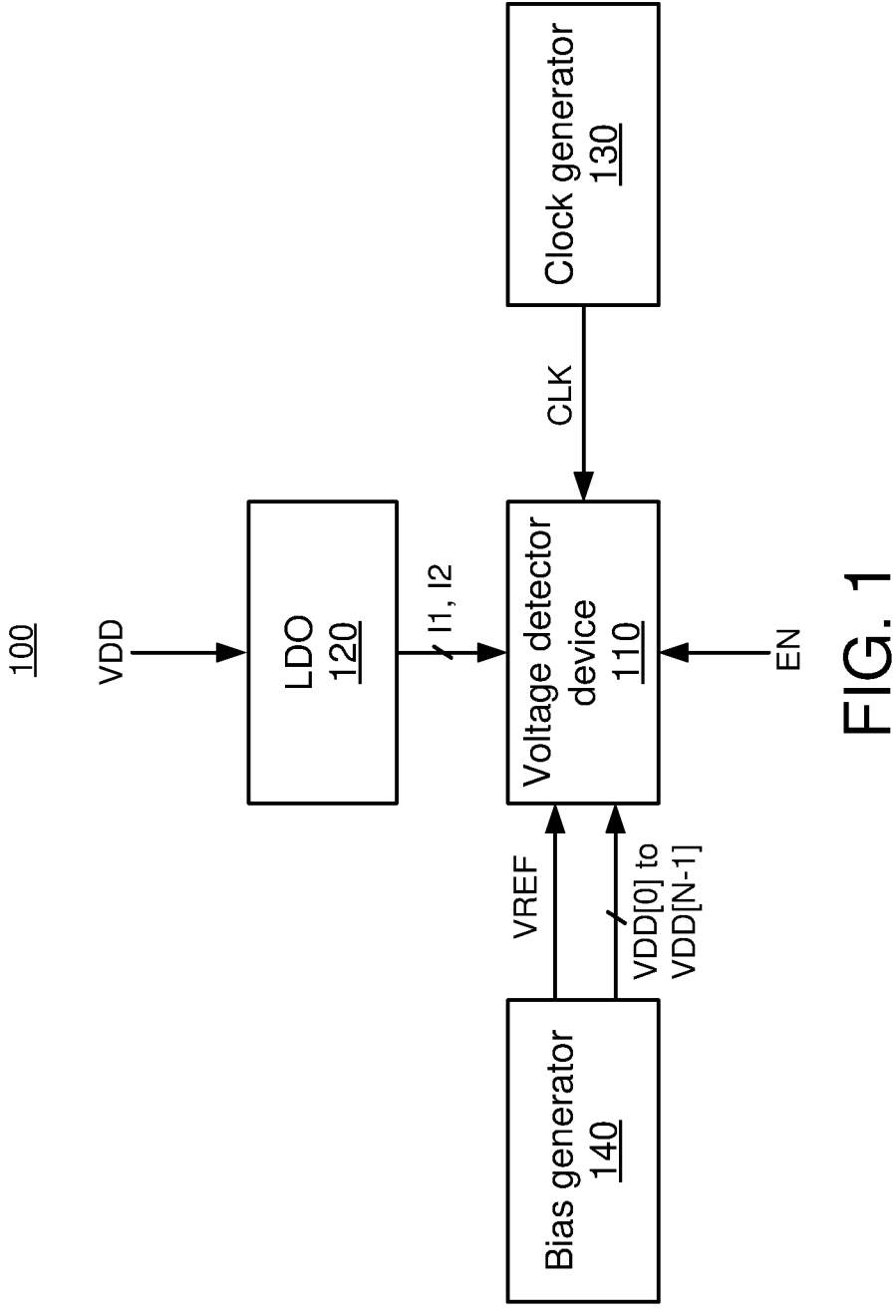
FIG. 1 is a schematic diagram of a chip system according to some embodiments of the present application.

FIG. 1 shows a schematic diagram of a chip system 100 according to some embodiments of the present application. In some embodiments, the chip system 100 may be used in, for example but not limited to, applications of a real-time clock (RTC) generator and/or power supply enable control. The chip system 100 may include a voltage detector device 100, a low dropout regulator (LDO) 120, a clock generator 130 and a bias generator 140.

The LDO 120, the clock generator 130 and the bias generator 140 may be powered by a power supply voltage VDD so as to provide corresponding signals. For example, the LDO 120 may be powered by the power supply voltage VDD so as to provide a current I1 and a current I2 to the voltage detector device 110. In some embodiments, the LDO 120 may generate a voltage (not shown) based on the power supply voltage VDD, and provide the voltage to power the voltage detector device 110, the clock generator 130 and/or the bias generator 140. The clock generator 130 may be powered by the power supply voltage VDD (or a voltage generated based on the power supply voltage VDD by the LDO 120) so as to provide a clock signal CLK. The bias generator 140 may be powered by the power supply voltage (or a voltage generated based on the power supply voltage VDD by the LDO 120) to generate a reference voltage VREF, and divide the power supply voltage VDD to generate multiple voltages VDD[0] to VDD[N−1], where the value N may be a positive integer greater than 1.

Figure 2:
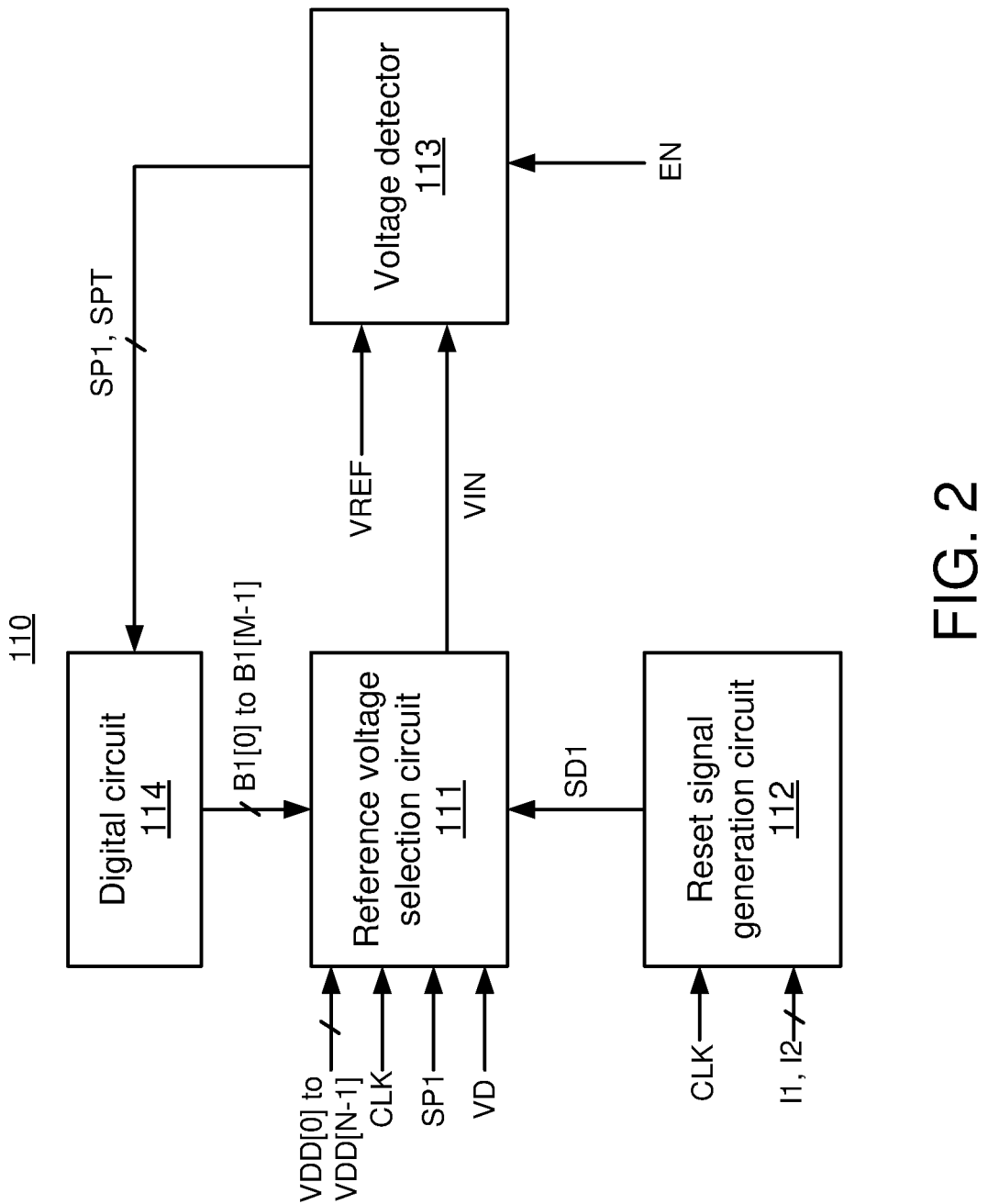
FIG. 2 is a schematic diagram of a voltage detector device in FIG. 1 according to some embodiments of the present application.

The voltage detector device 110 may receive the current I1, the current I2, the clock signal CLK, the reference voltage VREF, the multiple voltages VDD[0] to VDD[N−1] and an enable signal EN. In some embodiments, the voltage detector device 110 operates in a trimming phase when the enable signal EN has a first logical value (for example but not limited to, logic 1), so as to select a corresponding voltage from the multiple voltages VDD[0] to VDD[N−1] by using multiple bits B1[0] to B1[M−1) (as shown in FIG. 2), wherein the value M may be a positive integer greater than 1. Once the corresponding voltage is selected, the voltage detector device 110 stores values of the multiple bits B1[0] to B1[M−1] of the corresponding voltage selected. The voltage detector device 110 operates in a voltage detection phase when the enable signal EN has a second logical value (for example but not limited to, logic 0) different from the first logic value, so as to generate the corresponding voltage by using the multiple bits B1[0] to B1[M−1] previously stored, thereby detecting according to the corresponding voltage and the reference voltage VREF whether an anomaly occurs in the power supply voltage VDD. Operation details related to the trimming phase and the voltage detection phase are sequentially described with the accompanying reference drawings below.

FIG. 2 shows a schematic diagram of the voltage detector device 110 in FIG. 1 according to some embodiments of the present application. The voltage detector device 110 includes a reference voltage selection circuit 111, a reset signal generation circuit 112, a voltage detector 113 and a digital circuit 114. The reference voltage selection circuit 111 outputs an input voltage VIN according to the clock signal CLK, a detection signal SP1, a reset signal SD1 and the multiple bits B1[0] to B1[M−1]. For example, the reference voltage selection circuit 111 may output a corresponding voltage from the multiple voltages VDD[0] to VDD[N−1] to be the input voltage VIN or output a predetermined voltage VD to be the input voltage according to the multiple signals above. Configuration details related to the reference voltage selection circuit 111 are to be described with reference to FIG. 3 below.

The reset signal generation circuit 112 generates the reset signal SD1 according to the clock signal CLK and the multiple currents I1 and I2, wherein the multiple currents I1 and I2 are generated based on the power supply voltage VDD by the LDO 120 in FIG. 1. Configuration details of the reset signal generation circuit 112 are to be described with reference to FIG. 4A to FIG. 4C below.

The voltage detector 113 may compare the input voltage VIN with the reference voltage VREF to generate a detection signal SPT, and generate the detection signal SP1 according to the detection signal SPT and the enable signal EN. During the voltage detection phase, the voltage detector 113 may compare the input voltage IN with the reference voltage VREF to determine whether the power supply voltage VDD is stabilized at a target level, thereby detecting whether an abnormal voltage drop occurs in the power supply voltage VDD. Configuration details related to the voltage detector 113 are to be described with reference to FIG. 5 below.

The digital circuit 114 may adjust the multiple bits B1[0] to B1[M−1] according to the detection signal SPT to determine the values of the multiple bits B1[0] to B1[M−1] during the trimming phase, and may output the multiple bits B1[0] to B1[M−1] and be selectively reset according to the detection signal SP1 during the voltage detection phase. For example, during the trimming phase, the digital circuit 114 may execute a binary search algorithm according to the detection signal SPT and sequentially adjust the multiple bits B1[0] to B1[M−1], so as to further determine the values of the multiple bits B1[0] to B1[M−1]. During the voltage detection phase, the digital circuit 114 may output the multiple bits B1[0] to B1[M−1] determined during the trimming phase, so that the reference voltage selection circuit 111 may output the corresponding input voltage VIN to the voltage detector 113. Thus, the voltage detector 113 may compare this input voltage VIN with the reference voltage VREF, so as to detect whether the power supply voltage VDD has reached the target level. In case of an abnormal voltage drop occurring in the power supply voltage VDD such that the input voltage VIN becomes too low, the detection signal SP1 transitions to instruct the digital circuit 114 to be reset. In this case, the digital circuit 114 may be reset (for example, clearing internal circuit settings), so as to prevent any errors caused by the abnormal voltage drop. In some embodiments, the digital circuit 114 may be controlled by software and/or hardware in the system in order to perform the related operations above. In some embodiments, the digital circuit 114 may be disposed in such as a control circuit or a central processor in the system. Operation details related to the digital circuit 114 are to be described below with reference to FIG. 6 and FIG. 7 below.

With the configurations above, the voltage detector device 110 may select the input voltage VIN that is suitable for comparison with the reference voltage VREF during the trimming phase, so as to ensure that the voltage detector device 110 has a more accurate detection result during the voltage detection phase to thereby improve the operation reliability of the overall system. Since a reference voltage may be drifted due to manufacturing variations, a voltage detector device in some related art uses a high-precision bias circuit to generate a reference voltage and/or uses an additional correction mechanism to correct a level of a reference voltage in order to improve the accuracy of voltage detection. In other words, in the art above, the voltage detector device needs to apply an additional correction circuit and/or a high-precision bias circuit, resulting in a significant increase in the overall costs. Different from the art above, in some embodiments of the present application, the voltage detector device 110 does not correct the reference voltage VREF, but the input voltage VIN used for comparison with the reference voltage VREF is trimmed instead. The part of a circuit that adjusts the input voltage VIN and the part of a circuit that detects the power supply voltage are a shared circuit (for example, the reference voltage selection circuit 111 and the voltage detector 113), and so no high-precision bias circuit or additional correction circuit is involved. Thus, the overall circuit costs can be reduced.

Figure 3:
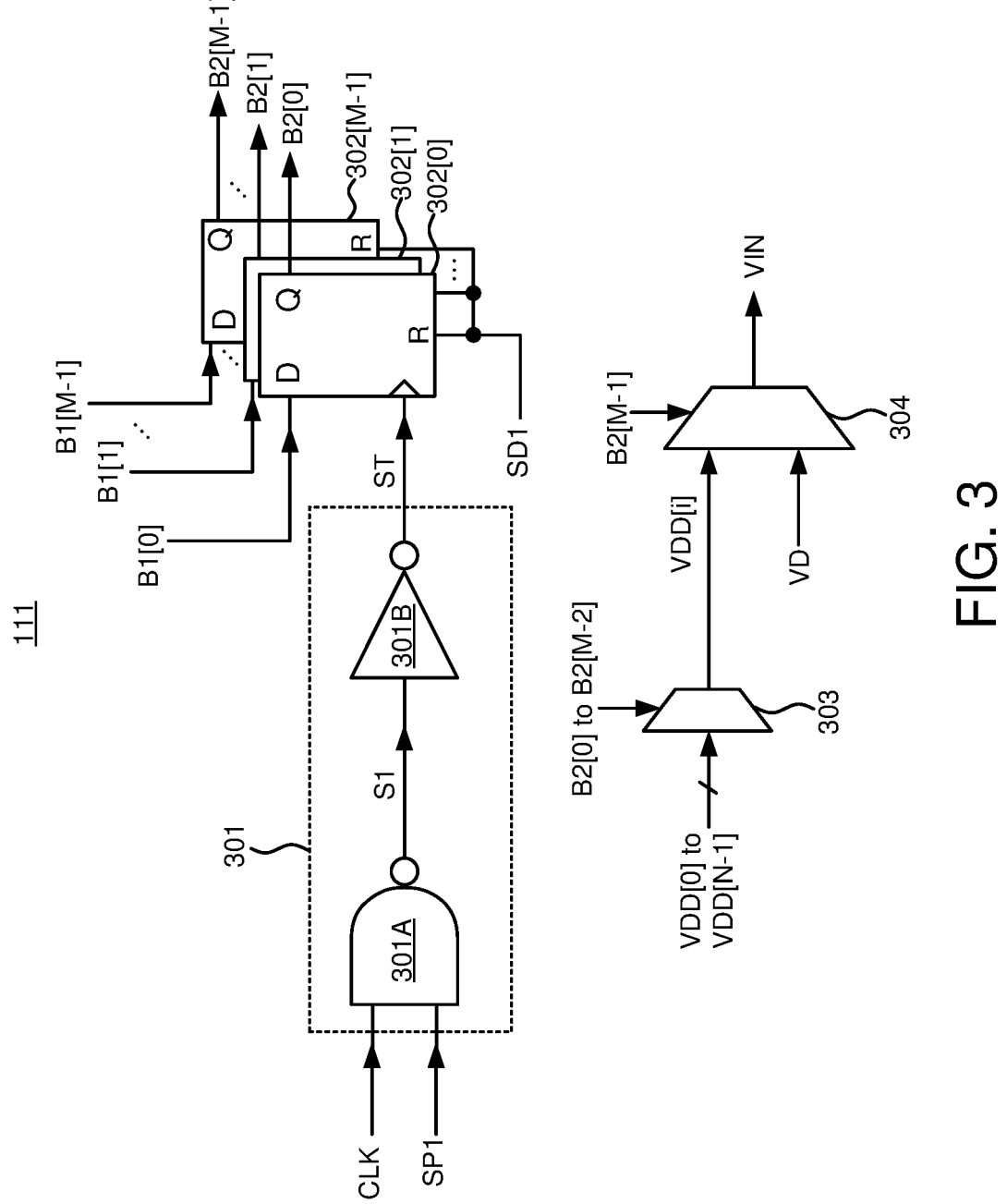
FIG. 3 is a schematic diagram of a reference voltage selection circuit in FIG. 2 according to some embodiments of the present application.

FIG. 3 shows a schematic diagram of the reference voltage selection circuit 111 in FIG. 2 according to some embodiments of the present application. The reference voltage selection circuit 111 includes a trigger 301, multiple flip-flops 302[0] to 302[M−1], a multiplexer 303 and a multiplexer 304. The trigger 301 generates a trigger signal ST according to the clock signal CLK and the detection signal SP1. More specifically, in some embodiments, the trigger 301 includes a logic gate 301A ad an inverter 301B. In some embodiments, the logic gate 301 may be, for example but not limited to, a NAND gate, which may generate a signal S1 according to the clock signal CLK and the detection signal SP1. The inverter 301B may generate the trigger signal ST according to the signal S1.

The multiple flip-flops 302[0] to 302[M−1] may be, for example but not limited to, D flip-flops. The multiple flip-flops 302[0] to 302[M−1] may output the multiple bits B1[0] to B1[M−1] to be multiple bits B2[0] to B2[M−1] according to the trigger signal ST, and may reset the multiple bits B2[0] to B2[M−1] according to the reset signal SD1. Taking the flip-flop 302[0] for example, the flip-flop 302[0] may output the bit B1[0] to be the bit B2[0] according to the trigger signal ST. Alternatively, when the reset signal SD1 has a predetermined value (for example but not limited to, logic 0), the flip-flop 302[0] may reset the bit B2[0] to logic 0. The correspondence and operation details of the remaining flip-flops 302[1] to 302[M−1], the remaining bits B1[1] to B1[M−1] and the remaining bits B2[1] to B2[M−1] can be referred from the description associated with the flip-flop 302[0], and are omitted herein.

The multiplexer 303 selects a corresponding voltage VDD[i] from the multiple voltages VDD[0] to VDD[N−1] according to part of the bits (for example but not limited to, the multiple bits B2[0] to B2[M−2]) of the multiple bits B2[0] to B2[M−1], wherein the value i may be any positive integer between the value 0 and the value N−1. The multiplexer 304 selectively outputs the corresponding voltage VDD[i] or the predetermined voltage VD to be the input voltage VIN according to a remaining bit (for example but not limited to, the bit B2[M−2]) in the multiple bits B2[0] to B2[M−1].

Figure 4A:
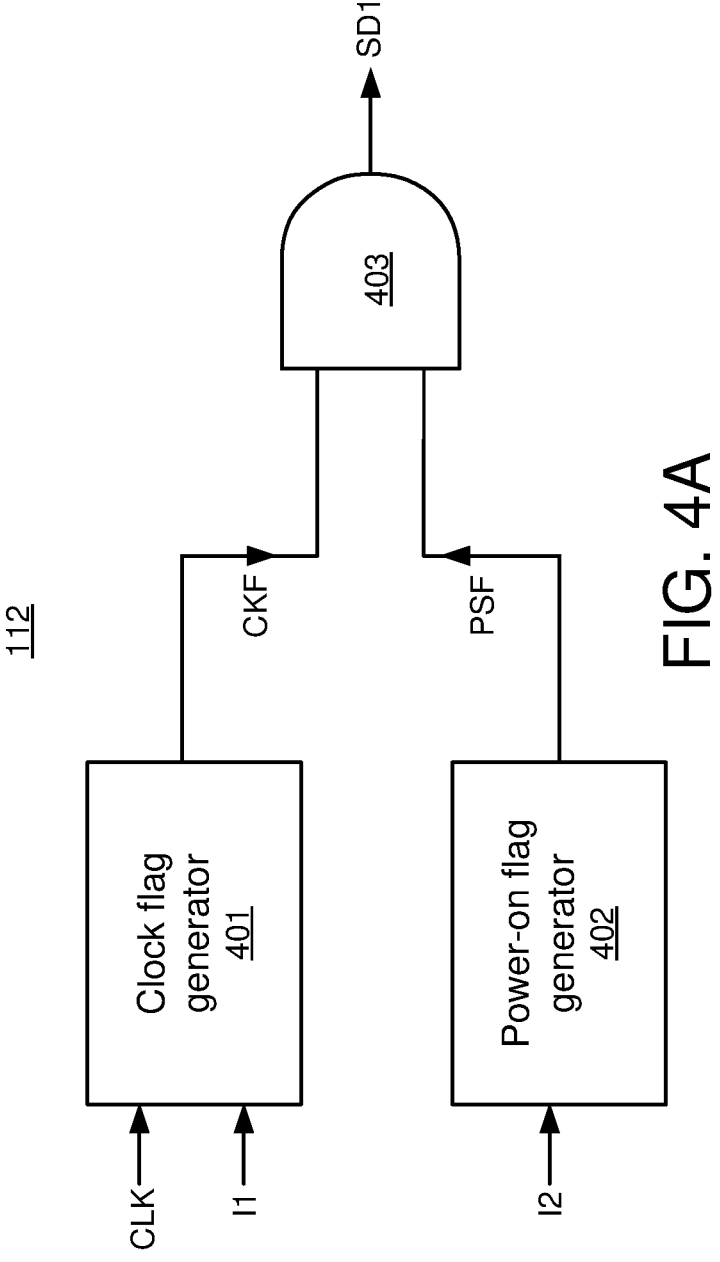
FIG. 4A is a schematic diagram of a reset signal generation circuit in FIG. 2 according to some embodiments of the present application.

FIG. 4A shows a schematic diagram of the reset signal generation circuit 112 in FIG. 2 according to some embodiments of the present application. In some embodiments, the reset signal generation circuit 112 may include a clock flag generator 401, a power-on flag generator 402 and a logic gate 403. The clock flag generator 401 generates a clock flag signal CKF according to the clock signal CLK and the current I1. The power-on flag generator 402 generates a power-on flag signal PSF according to the current I2. The logic gate 403 may generate the reset signal SD1 according to the clock flag signal CKF and the power-on flag signal PSF. In some embodiments, the logic gate 403 may be, for example but not limited to, an AND gate. In some embodiments, the reset signal SD1 may be used to indicate whether the clock generator 130 in FIG. 1 currently operates in a stable state (that is, being capable of stably generating the clock signal CLK having a predetermined cycle) after power-on. The clock generator 130 starts oscillating after power-on of the power supply voltage VDD, and starts to generate the clock signal CLK. The clock signal CLK may be unstable in a short period after power-on of the power supply voltage VDD, such that the clock flag signal CKF may also be unstable during the same period. Thus, by generating the reset signal SD1 by the logic gate 403 according to the clock flag signal CKF and the power-on flag signal PSF, the reset signal SD1 can be prevented from being affected by the unstable clock flag signal CKF in a period after power-on of the power supply voltage VDD and hence from continually and incorrectly having the same logic value.

Figure 4B:
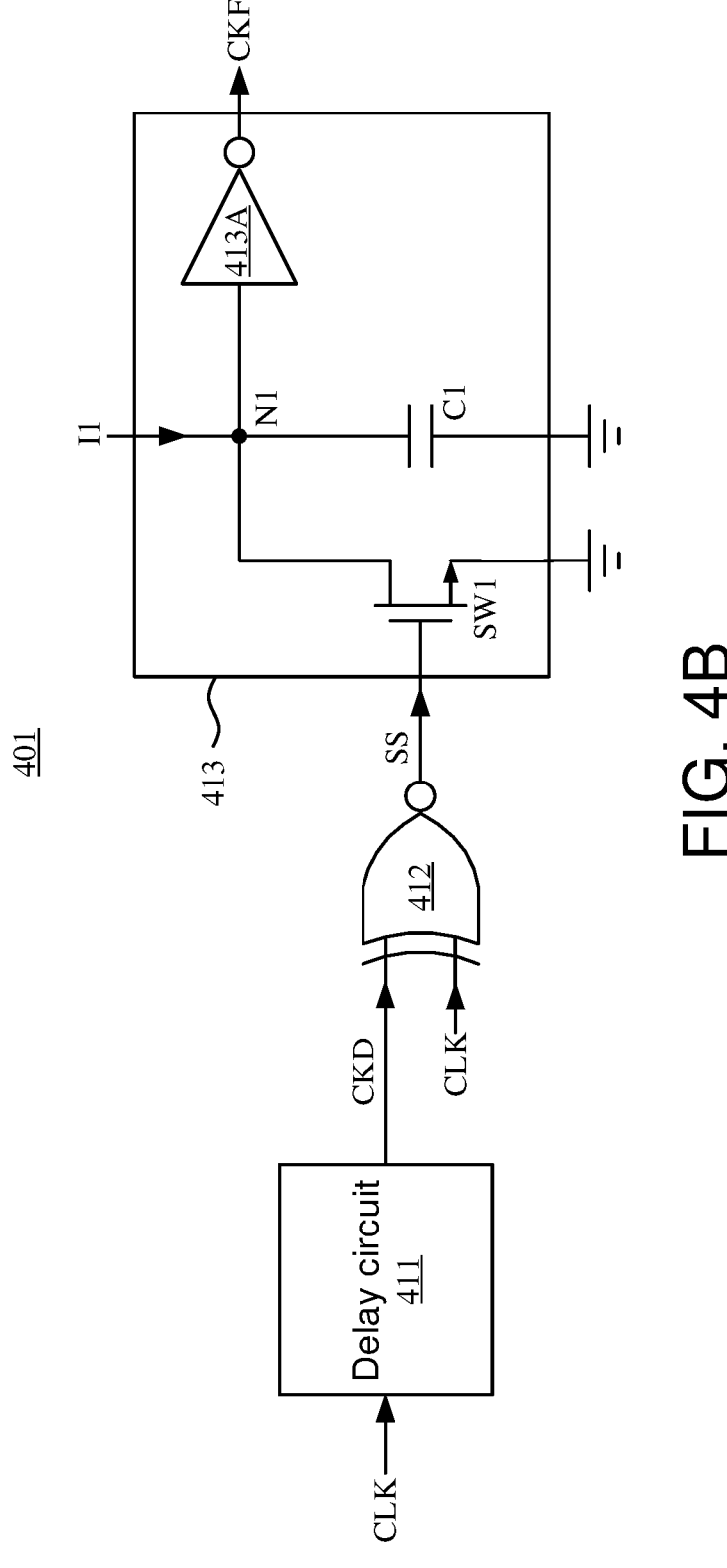
FIG. 4B is a schematic diagram of a clock flag generator in FIG. 4A according to some embodiments of the present application.

FIG. 4B shows a schematic diagram of the clock flag generator 401 in FIG. 4A according to some embodiments of the present application. The clock flag generator 401 includes a delay circuit 411, a logic gate 412 and a switched capacitor circuit 413. The delay circuit 411 may delay the clock signal CLK to generate a signal CKD (equivalent to a delay of the clock signal CLK) by delaying the clock signal CLK. In some embodiments, the delay circuit 411 may be implemented by one or more digital circuits coupled in series. The logic gate 412 generates a switching signal SS according to the clock signal CLK and the signal CKD. In some embodiments, the logic gate 412 may be, for example but not limited to, an XOR gate. The switched capacitor circuit 413 adjusts a level of a node N1 according to the current I1 and the switching signal SS, and generates the clock flag signal CKF according to the level of the node N1. For example, the switched capacitor circuit 413 includes a capacitor C1, a switch SW1 and an inverter 413A. The capacitor C1 is coupled between the node N1 and the ground, and is charged by the current I1 to increase the level of the node N1. The switch SW1 is coupled between the node N1 and the ground, and is selectively turned on according to the switching signal SS, so as to bypass the current I1 to the ground and to discharge the capacitor C1 via the switch SW1, thereby decreasing the level of the node N1. The inverter 413A is coupled to the node N1, and generates the clock flag signal CKF according to the level of the node N1.

More specifically, after power-on of the power supply voltage VDD, the LDO 120 starts to generate the current I1, such that the capacitor C1 is charged by the current I1 and the level of the node N1 is increased. In this case, the inverter 413A outputs the clock flag signal CKF having a low level. Next, when the logic gate 412 outputs the switching signal SS having a high level, the switch SW1 is turned on and the level of the node N1 is accordingly decreased. As the number of times by which the switch SW1 is turned on, the level of the node N1 becomes lower and lower. When the level of the node N1 is lower than a threshold, an output of the inverter 413A transitions and the clock flag signal CKF having a high level is generated.

Figure 4C:
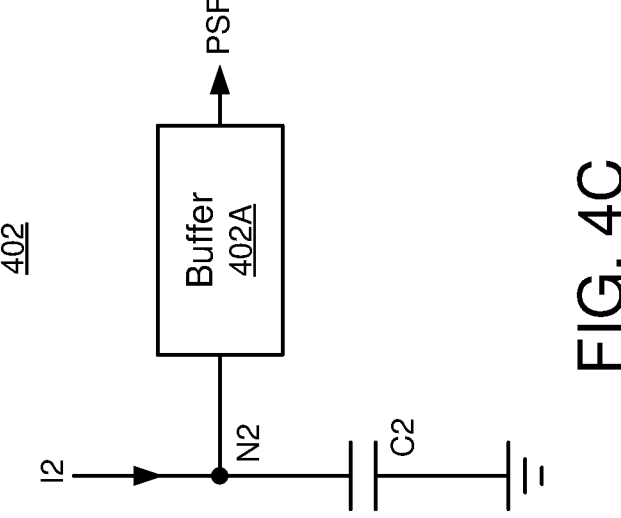
FIG. 4C is a schematic diagram of a power-on flag generator in FIG. 4A according to some embodiments of the present application.

FIG. 4C shows a schematic diagram of the power-on flag generator 402 in FIG. 4A according to some embodiments of the present application. In some embodiments, the power-on flag generator 402 includes a capacitor C2 and a buffer 402A. The capacitor C2 is coupled between the node N2 and the ground, and is charged by the current I2 to increase the level of the node N2. The buffer 402A is coupled to the node N2, and generates the power-on flag signal PSF according to the level of the node N2. In some embodiments, the buffer 402A may be implemented by, for example but not limited to, an even number of inverters connected in series. After power-on of the power supply voltage VDD, the LDO 120 starts to generate the current I2, such that the capacitor C2 is charged by the current I2 and the level of the node N2 is increased. When the level of the node N2 is still lower than a threshold, the buffer 402A generates the power-on flag signal PSF having a low level. Alternatively, when the level of the node N2 starts to be higher than the threshold, the buffer 402A switches to generate the power-on flag signal PSF having a high level.

Figure 5:
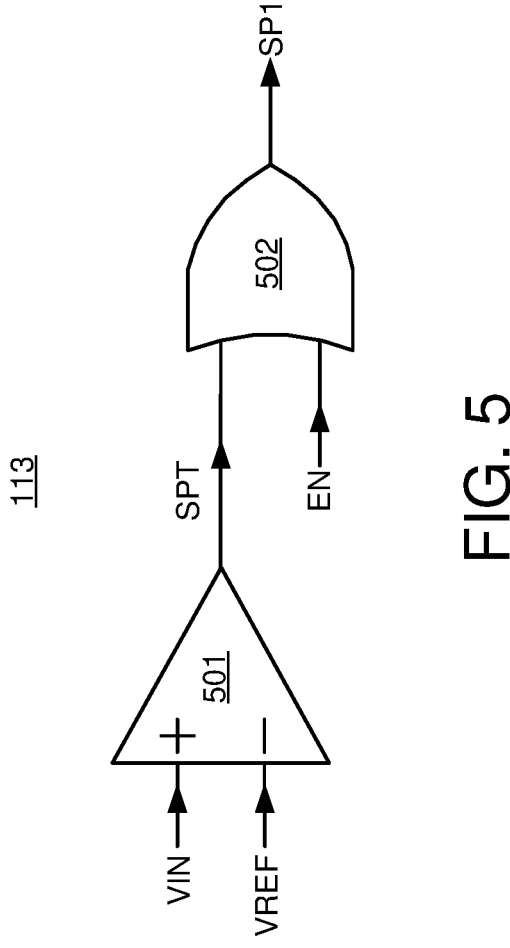
FIG. 5 is a schematic diagram of a voltage detector in FIG. 2 according to some embodiments of the present application.

FIG. 5 shows a schematic diagram of the voltage detector 113 in FIG. 2 according to some embodiments of the present application. In some embodiments, the voltage detector 113 includes a comparator 501 and a logic gate 502. The comparator circuit 501 compares the input voltage VIN with the reference voltage VREF to generate the detection signal SPT. The logic gate 502 may generate the detection signal SP1 according to the detection signal SPT and the enable signal EN. In some embodiments, the logic gate 502 may be, for example but not limited to, an OR gate, and may output the detection signal SP1 continuously having logic 1 when the enable signal EN has logic 1 (that is, during the trimming phase), thereby preventing the digital circuit 114 from being reset. On the other hand, when the enable signal EN has logic 0 (that is, during the voltage detection phase), the logic gate 502 may output the detection signal SPT to be the detection signal SP1 in response to the enable signal EN.

FIG. 6 shows a flowchart of multiple operations performed by the voltage detector device 110 in FIG. 2 during the trimming phase according to an embodiment of the present application. In operation S610, the enable signal EN having a first logical value is received to generate the detection signal SP1 having the first logical value. As described above, during the trimming phase, the enable signal EN has logic 1 (equivalent to the first logical value above). In this case, the voltage detector 113 generates the detection signal SP1 having logic 1 in response to the enable signal EN, thereby preventing the digital circuit 114 from being reset.

In operation S620, the power supply voltage VDD is adjusted to the target level. For example, if a normal working level of the power supply voltage VDD is about 1.6 V to 3.63 V, the target level may be set to be about 1.5 V. In some embodiments, the target level is a level sufficient for the clock generator 130 in FIG. 1 to oscillate and hence start to generate the clock signal CLK. In some embodiments, the digital circuit 114 may issue at least one signal to other circuits (for example, the LDO 120) or a power management circuit (not shown) in the system, so as to perform operation S620.

In operation S630, the multiple bits B1[0] to B1[M−1] are output to be multiple bits B2[0] to B2[M−1] according to the trigger signal ST. As described above, the clock generator 130 may start to generate the clock signal CLK when the power supply voltage VDD is at the target level. Thus, the trigger 301 in FIG. 3 may generate the trigger signal ST that switches along with the clock signal CLK. In this case, the multiple flip-flops 302[0] to 302[M−1] output the multiple bits B1[0] to B1[M−1] to be the multiple bits B2[0] to B2[M−1] according to the trigger signal ST, respectively.

In operation S640, a binary search algorithm is executed according to the detection signal SPT to determine the values of the multiple bits B1[0] to B1[M−1]. For example, the digital circuit 114 may first generate a first set of bits B1[0] to B1[M−1] (corresponding to one having an intermediate level among the multiple voltages VDD[0] to VDD[N−1]), and the reference voltage selection circuit 111 may select the one having an intermediate level (that is, corresponding to the voltage VDD[i]) from the multiple voltages VDD[0] to VDD[N−1] to be the input voltage VIN according to this set of bits B1[0] to B1[M−1], and the reference voltage selection circuit 111 may then compare this input voltage VIN with the reference voltage VREF. If the input voltage VIN is higher than the reference voltage VREF, the detection signal SPT has logic 1. Next, the digital circuit 114 may switch to output a second set of bits B1[0] to B[M−1], for the reference voltage selection circuit 111 to select a next voltage having a level lower than the intermediate level above from the multiple voltages VDD[0] to VDD[N−1] and output the next voltage to be the input voltage VIN. If the input voltage VIN changes to be lower than the reference voltage VREF, the detection signal SPT switches to logic 0. Thus, the digital circuit 114 may determine whether the values of one set of bits B1[0] to B1[M−1] suitable for the reference voltage VREF are the first set of bits or the second set of bits.

Alternatively, if the input voltage VIN corresponding to the first set of bits B1[0] to B1[M−1] is lower than the reference voltage VREF, the detection signal SPT has logic 0. Next, the digital circuit 114 may switch to output a third set of bits B1[0] to B[M−1], for the reference voltage selection circuit 111 to select a next voltage having a level higher than the intermediate level above from the multiple voltages VDD[0] to VDD[N−1] and output the next voltage to be the input voltage VIN. If the input voltage VIN changes to be higher than the reference voltage VREF, the detection signal SPT switches to logic 1. Thus, the digital circuit 114 may determine whether the values of one set of bits B1[0] to B1[M−1] suitable for the reference voltage VREF are the first set of bits or the third set of bits. Similarly, by iterating the process above, the digital circuit 114 is able to determine the values of the multiple bits B1[0] to B1[M−1] according to the detection signal SPT. It should be noted that the adjustment means described above is a simple binary search algorithm, and the present application is not limited to such example. Various suitable adjustment means based on binary search algorithms are to be encompassed within the scope of the present application.

In operation S650, the values of the multiple bits B1[0] to B1[M−1] are stored. In some embodiments, the digital circuit 114 may include at least one storage circuit (for example but not limited to, a register), which can store the values of the multiple bits B1[0] to B1[M−1] determined in operation S640.

FIG. 7 shows a flowchart of multiple operations performed by the voltage detector device 110 in FIG. 2 during the voltage detection phase according to an embodiment of the present application. In operation S710, during a first period shortly after power-on of the power supply voltage VDD, the multiple bits B2[0] to B2[M−2] are reset to logic 0, so as to output the predetermined voltage VD to be the input voltage VIN. For example, within an initial period shortly after power-on of the power supply voltage VDD, the reset signal SD1 is logic 0 (because the level of the node N2 in FIG. 3 is not yet high enough), so that the multiple flip-flops 302[0] to 302[M−1] reset the multiple bits B2[0] to B2[M−2] to logic 0. Since the multiple bits B2[0] to B2[M−2] have logic 0, the multiplexer 304 outputs the predetermined voltage VD to be the input voltage VIN.

In operation S720, during a second period after power-on of the power supply voltage VDD, the multiple flip-flops 302[0] to 302[M−1] output the multiple bits B1[0] to B1[M−1] to be the multiple bits B2[0] to B2[M−2]. For example, within a period after power-on of the power supply voltage, when the level of the node N2 in FIG. 3 is high enough, the reset signal SD1 switches to logic 1, so that the multiple flip-flops 302[0] to 302[M−1] are not reset but instead start to output the multiple bits B1[0] to B1[M−1] to be the multiple bits B2[0] to B2[M−2] according to the trigger signal ST.

In operation S730, the digital circuit 114 outputs the multiple bits B1[0] to B1[M−1] stored previously, so as to output the corresponding voltage VDD[i] to be the input voltage VIN. In operation S740, the input voltage VIN is compared with the reference voltage VREF to detect whether an abnormal voltage drop occurs in the power supply voltage VDD. For example, the digital circuit 114 may output the multiple bits B1[0] to B1[M−1] stored in operation S650 in FIG. 6, for the reference voltage selection circuit 111 to output the input voltage VIN suitable for this reference voltage VREF, so as to start to determine by comparing the reference voltage VREF with the input voltage VIN whether an abnormal voltage drop occurs in the power supply voltage VDD.

FIG. 8 shows a flowchart of a voltage detection method 800 according to some embodiments of the present application. In operation S810, a corresponding one voltage of a plurality of predetermined first voltages is output to be an input voltage according to a clock signal, a first detection signal, a reset signal and a plurality of first bits, wherein the first voltages are generated based on a power supply voltage. In operation S820, the reset signal is generated according to the clock signal and a plurality of currents, wherein the currents are generated based on the power supply voltage. In operation S830, the input voltage is compared with a reference voltage to generate a second detection signal, and the first detection signal is generated according to the second detection signal and an enable signal. In operation S840, the first bits are adjusted according to the second detection signal to determine values of the first bits during a trimming phase, and the first bits are output by the digital circuit and the digital circuit is selectively reset according to the first detection signal during a voltage detection phase.

Details associated with the multiple operations of the voltage detection method 800 above can be referred from the details of the embodiments above, and are omitted herein. The multiple operations of the voltage detection method 800 above are merely examples, and are not limited to being performed in the order specified in these examples. Without departing from the operation means and ranges of the various embodiments of the present application, additions, replacements, substitutions or omissions may be made to the operations of the voltage detection method 800, or the operations may be performed in different orders (for example, entirely simultaneously performed or partially simultaneously performed).

In conclusion, the voltage detector device and the voltage detection method according to some embodiments of the present application are capable of identifying a voltage suitable for a current reference voltage by using a voltage trimming mechanism, and detecting whether an anomaly occurs in a power supply voltage by using this voltage and the reference voltage. Thus, voltage detection can be performed more accurately without involving any high-preci-sion reference voltage or any reference voltage correction mechanism, thereby improving system reliability and reducing overall circuit costs.

While the present application has been described by way of example and in terms of the preferred embodiments, it is to be understood that the disclosure is not limited thereto. Various modifications made be made to the technical features of the present application by a person skilled in the art on the basis of the explicit or implicit disclosures of the present application. The scope of the appended claims of the present application therefore should be accorded with the broadest interpretation so as to encompass all such modifi-cations.

What is claimed is:

1. A voltage detector device, comprising:
a reference voltage selection circuit, outputting a corre-sponding one of a plurality of first voltages to be an input voltage according to a clock signal, a first detec-tion signal, a reset signal and a plurality of first bits, wherein the first voltages are generated based on a power supply voltage;
a reset signal generation circuit, generating the reset signal according to the clock signal and a plurality of currents, wherein the currents are generated based on the power supply voltage;
a voltage detector, comparing the input voltage with a reference voltage to generate a second detection signal, and generating the first detection signal according to the second detection signal and an enable signal; and
a digital circuit, adjusting the first bits according to the second detection signal to determine values of the first bits during a trimming phase, and outputting the first bits and selectively reset according to the first detection signal during a voltage detection phase.

2. The voltage detector device according to claim 1, wherein the reset signal generation circuit comprises:
a clock flag generator, generating a clock flag signal according to the clock signal and a first current of the currents;
a power-on flag generator, generating a power-on flag signal according to a second current of the currents; and
a first logic gate, generating the reset signal according to the clock flag signal and the power-on flag signal.

3. The voltage detector device according to claim 2, wherein the clock flag generator comprises:
a delay circuit, delaying the clock signal to generate a first signal;
a second logic gate, generating a switching signal accord-ing to the clock signal and the first signal; and
a switched capacitor circuit, adjusting a level of a node according to the first current and the switching signal, and generating the clock flag signal according to the level of the node.

4. The voltage detector device according to claim 3, wherein the switched capacitor circuit comprises:
a capacitor, coupled to the node, charged by the first current to increase the level of the node;
a switch, coupled between the node and a ground, selec-tively turned on according to the switching signal so as to decrease the level of the node; and
an inverter, generating the clock flag signal according to the level of the node.

5. The voltage detector device according to claim 2, wherein the power-on flag generator comprises:
a capacitor, coupled to a node, charged by the second current to increase the level of the node; and a buffer, generating the power-on flag signal according to the level of the node.

6. The voltage detector device according to claim 1, wherein the reference voltage selection circuit comprises:

a trigger, generating a trigger signal according to the clock signal and the first detection signal;

a plurality of flip-flops, outputting the first bits to be a plurality of second bits according to the trigger signal, respectively, and resetting the second bits according to the reset signal;

a first multiplexer, selecting the corresponding voltage from the first voltages according to part of bits in the second bits; and a second multiplexer, outputting one of the corresponding voltage and a predetermined voltage to be the input voltage according to a remaining bit of the second bits.

7. The voltage detector device according to claim 6, wherein the trigger comprises:

a logic gate, generating a first signal according to the clock signal and the first detection signal; and an inverter, generating the trigger signal according to the first signal.

8. The voltage detector device according to claim 1, wherein the enable signal has a first logical value during the trimming phase, and the voltage detector generates the first detection signal having the first logical value in response to the enable signal during the trimming phase so as to prevent the digital circuit from being reset during the trimming phase.

9. The voltage detector device according to claim 8, wherein the enable signal has a second logical value different from the first logical value during the voltage detection phase, and the voltage detector outputs the second detection signal to be the first detection signal in response to the enable signal during the voltage detection phase.

10. The voltage detector device according to claim 1, wherein the voltage detector comprises:

a comparator, comparing the input voltage with the reference voltage to generate the second detection signal; and a logic gate, generating the first detection signal according to the second detection signal and the enable signal.

11. The voltage detector device according to claim 1, wherein the digital circuit executes a binary search algorithm according to the second detection signal during the trimming phase so as to determine values of the first bits.

12. A voltage detection method, comprising:

outputting a corresponding one of a plurality of first voltages to be an input voltage according to a clock signal, a first detection signal, a reset signal and a plurality of first bits, wherein the first voltages are generated based on a power supply voltage;

generating the reset signal according to the clock signal and a plurality of currents, wherein the currents are generated based on the power supply voltage;

comparing the input voltage with a reference voltage to generate a second detection signal, and generating the first detection signal according to the second detection signal and an enable signal; and adjusting the first bits by a digital circuit according to the second detection signal to determine values of the first bits during a trimming phase, and outputting the first bits by the digital circuit and selectively resetting the digital circuit according to the first detection signal during a voltage detection phase.

* * * * *